United States Patent [19]
Bakardjiev et al.

[11] 4,119,829
[45] Oct. 10, 1978

[54] DEVICE FOR PRODUCING PULSES FOR THE IGNITION AND STABILIZATION OF AN ELECTRIC-ARC PROCESS

[75] Inventors: Vassil Dimitrov Bakardjiev; Emil Assenov Doychinov, both of Sofia, Bulgaria

[73] Assignee: Institute po Zavaryavane, Sofia, Bulgaria

[21] Appl. No.: 788,793

[22] Filed: Apr. 19, 1977

[30] Foreign Application Priority Data

Apr. 20, 1976 [BG] Bulgaria ................................... 32959

[51] Int. Cl.² ............................................. B23K 9/06
[52] U.S. Cl. ................................ 219/130.4; 315/175
[58] Field of Search ........... 219/131 WR, 131 R, 135, 219/130.4; 315/171, 172, 173, 175, 176

[56] References Cited

U.S. PATENT DOCUMENTS

| 2,516,037 | 7/1950 | Williams | 219/131 R |
| 3,637,974 | 1/1972 | Tajbl et al. | 219/135 |

FOREIGN PATENT DOCUMENTS

| 37-12,909 | 3/1960 | Japan | 219/131 R |
| 655,829 | 8/1951 | United Kingdom | 219/131 R |
| 907,750 | 10/1962 | United Kingdom | 219/131 R |
| 1,397,337 | 6/1975 | United Kingdom. | |

*Primary Examiner*—Joseph V. Truhe
*Assistant Examiner*—Clifford C. Shaw
*Attorney, Agent, or Firm*—Karl F. Ross

[57] ABSTRACT

A control circuit for an electric arc process in which the stabilization pulses are applied across the arc electrode by the secondary winding of a transformer through a separating condenser and a spark gap. The circuit includes a further condenser bridged across this secondary winding, a noncontrollable semiconductor network connected in series with the primary of this transformer, a charging condenser connected across the primary in series with the noncontrollable conductor network, and a resistor connected in series with this charging condenser across the current supply for the discharge process.

3 Claims, 1 Drawing Figure

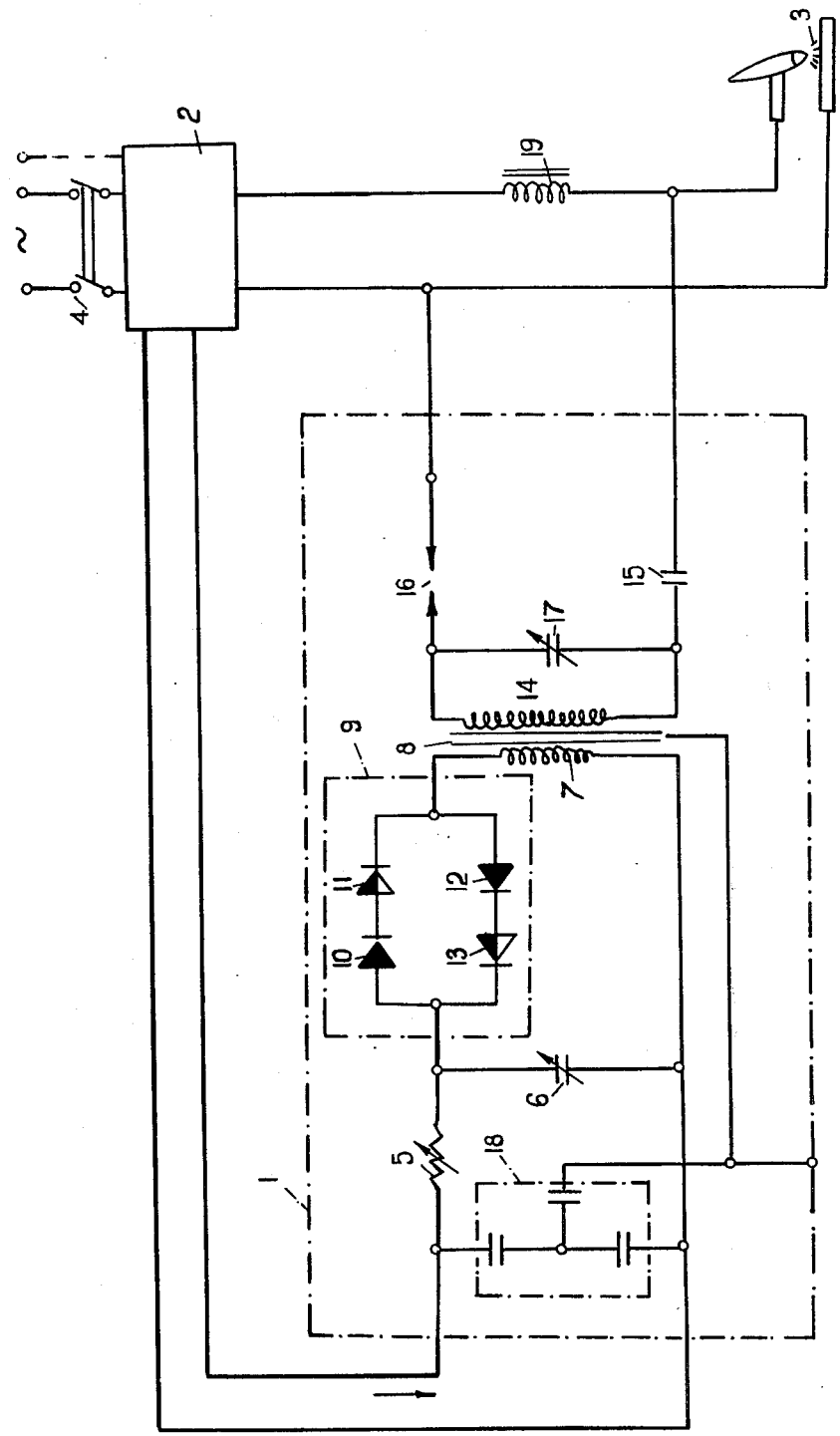

DEVICE FOR PRODUCING PULSES FOR THE IGNITION AND STABILIZATION OF AN ELECTRIC-ARC PROCESS

FIELD OF THE INVENTION

This invention relates to a device for producing pulses for the ignition and the stabilization of an electric arc process with or without a protective medium, particularly in an AC electric arc process where bipolar pulses are necessary, the number of which is greater or a multiple of the frequency of the AC, as well as in DC electric arc processes where the number of unipolar pulses can be regulated to be from 0 to 1000 per second.

BACKGROUND OF THE INVENTION

A device for producing pulses for the ignition and the stabilization of electric arc processes is known which is supplied with DC through a charging resistance, consisting of a pulse condenser and a commutating link of non-controlled semiconductors (dynistor), connected in series in the primary circuit of a high-frequency transformer, in parallel to the secondary winding of which there is connected an additional condenser.

The drawback of this device lies in that the unipolar pulses which are produced, that are not suitable for the ignition and the stabilization of the electric arc in AC electric arc processes.

Another known device for producing pulses for the ignition and the stabilizytion of electric arc processes comprises a pulse condenser and a commutating link, included in the primary winding of a high-frequency transformer, whose secondary winding is connected through a separating condenser in parallel to the circuit of the electric arc.

The drawback of this device is that the formation of the pulses is effected by a thyristor controlled by an additional block, this resulting in a device with complex circuitry of large size high weight and high price.

OBJECT OF THE INVENTION

It is, therefore, a general object of the present invention to provide a device for the ignition and the stabilization of an AC electric arc process bipolar pulses regulatable as to number and shape and also of DC electric arc processes by means of unipolar pulses regulatable in number and shape, which has simplified circuitry, smaller volume and weight, and lower cost.

SUMMARY OF THE INVENTION

This object is achieved by a device for producing pulses for the ignition and stabilization of an electric arc process e.g. welding which comprises of regulable or chosen by magnitude charging resistance and pulse condenser controllable or selected as to magnitude in accordance with the desired parameters, which are connected in series to the electric supply circuit, while the primary winding of a high-frequency transformer and a commutating link of non-controllable semiconductors connected in series, are tied in parallel to the pulse condenser. It is expedient that the commutating link consists of two pairs of a series connected diode and dynistor, connected in parallel but oppositely poled as to conductivity. The secondary winding of the high-frequency transformer, bridged by an additional, regulatable or condenser which can be selected by magnitude, is connected in parallel to the circuit of the electric arc, through a separating condeser and a spark gas.

BRIEF DESCRIPTION OF THE DRAWING

For a better understanding of the invention, reference should be made to the accompanying drawing the sole FIGURE of which is a circuit diagram as a device for producing pulses for the ignition and stabilization of a AC electric arc according to the invention.

SPECIFIC DESCRIPTION

According to the drawing, the device 1 for producing pulses for the ignition and stabilization of electric arc processes 1 is supplied by a source 2, which also feeds the electric arc 3. It is expedient to connect the device 1 and the electric arc 3 to a common switch 4. To the supply circuit of device 1 there are connected in series a lable or chosen by magnitude charging resistance 5 and pulse condenser 6 which are regulatable or selected as to magnitude. In parallel with the pulse condenser 6 there is connected the connected primary winding 7 of a high-frequency transformer 8 and a commutating link of non-regulable semiconductors 9 is series with primary. The commutating link 9 consists of two pairs of series-connected diode and dynistors 10, 11 and 12, 13, which by conductivity are connected in parallel (i.e. the two pairs are oppositely poled). The secondary winding 14 of the high-frequency transformer 8 is connected through the separating condenser 15 and the spark gap 16 to the supply circuit of the electric arc 3. To the secondary winding 14 of transformer 8 there is connected in parallel an additional condenser 17.

To the source 2 for electric supply of the device for producing pulses for the ignition and stabilization of electric arc processes 1 and the electric arc 3 there is included a filter 18 for suppressing and eliminating any interference from the electric circuits.

The device of the invention operates as follows:

When the switch 4 is switched on, an alternating voltage, 220 volts for example, is supplied to the input of the device 1, and the pulse condenser 6 is charged through the charging resistance 5 in each half-cycle. Upon charging during the positive half-cycle, when the voltage of the pulse condenser 6 reaches the magnitude of unblocking the dynistor 11 (forward threshold), then the pulse condenser 6 is discharged through diode 10, dynistor 11 and the primary winding 7 of the high-frequency transformer 8. Through the secondary winding 14 and the connected to it spark discharger 16 and additional condenser 17, through the separating condenser 15 at the output of the device there is produced a high-voltage pulse of desired shape and a duration of from 1 to 10 microseconds. For charging of the pulse condenser 6 in the negative half-cycle, the process is analogous, the discharge of the pulse condenser 6 taking place through diode 12 and dynistor 13. At the output of device 1 there is obtained a current pulse of high voltage with the same shape and duration as the pulse preceding it, but of opposite polarity. The bipolar pulses produced by the device are in phase with the supplying voltage, i.e. in phase with the voltage of the electric arc.

The frequency of repetition of the pulses in each half-cycle of the voltage supplied to device 1, depends on the characteristics of the chosen type of dynisters 11 and 13 and the magnitudes of the charging resistance 5 and the pulse condenser 6. The shapes of the pulses produced by the device are also influenced by the inductivity of the primary winding 7 of the high-frequency transformer 8 and the magnitudes of the spark gap 16 and the additional condenser 17. By varying the number of the turns of the secondary winding (coil) 14, by commutating for example, it is possible to produce pulses of the desired amplitude or magnitude of the voltage. Condenser 15 serves as separating condenser at the output of device 1 towards the circuit of the electric arc 3.

The device of the invention can also operate when supplied with DC; in this case unipolar pulses are produced at its output with very great possibilities for regulating their shape, as well as their frequency, from 0 to 1000 pulses per second for example. Thus, the device can be used for the ignition of an DC electric arc, and there is a possibility of self-switching-off during the burning of the arc, and for this it is sufficient to use the voltage drop at the output of the common source 2 for current for the electric arc and the device 1, which in this particular case is for DC.

When using the device for the ignition of an AC and DC electric arc, it is necessary for the current source 2 to be protected from the penetration of the high-voltage pulses by means of a choke of low inductivity 19.

What we claim is:

1. A control circuit for a discharge process in which a current source is connected across electrodes for generating an arc discharge, said circuit producing pulses for the ignition and stabilization of the arc, said circuit comprising:
    a high frequency transformer having a primary winding and a secondary winding;
    a separating condenser and a spark gap connected in series with said secondary winding across said electrodes;
    a commutating link of noncontrollable semiconductors connected in series with said primary winding in a series network, said commutating link including a first diode and a first dynister in series and poled in one direction, and a second diode in series with a second dynister poled in the opposite direction and connected in parallel with the first diode and first dynister;
    a pulse condenser connected across said network; and
    a charging resistor connected in series with said charging condenser across said source, said commutating link being tied to the junction between said charging resistor and said pulse condenser.

2. The circuit defined in claim 1, further comprising an additional condenser connected across said secondary winding.

3. The circuit defined in claim 2 wherein said charging resistor, said pulse condenser and said additional condenser are variable.

* * * * *